(12) United States Patent
Costrini et al.

(10) Patent No.: US 6,974,770 B2
(45) Date of Patent: Dec. 13, 2005

(54) SELF-ALIGNED MASK TO REDUCE CELL LAYOUT AREA

(75) Inventors: Gregory Costrini, Hopewell Junction, NY (US); Kia-Seng Low, Hopewell Junction, NY (US); David L. Rath, Stormville, NY (US); Michael C. Gaidis, Wappingers Falls, NY (US); Walter Glashauser, Ringstrasse (DE)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 261 days.

(21) Appl. No.: 10/600,034

(22) Filed: Jun. 20, 2003

(65) Prior Publication Data

US 2004/0259358 A1 Dec. 23, 2004

(51) Int. Cl.[7] .................. H01L 21/4763; H01L 21/311

(52) U.S. Cl. ...................... 438/637; 438/700; 438/719; 438/723; 438/724; 438/690

(58) Field of Search ................................. 438/623, 624, 438/637, 689–693, 700, 719, 723, 724

(56) References Cited

U.S. PATENT DOCUMENTS

| | | | |
|---|---|---|---|
| 6,482,689 B2 * | 11/2002 | Trivedi ........................ | 438/200 |
| 6,803,318 B1 * | 10/2004 | Qiao et al. .................. | 438/700 |
| 6,806,195 B1 * | 10/2004 | Enomoto et al. ........... | 438/700 |
| 6,812,141 B1 * | 11/2004 | Gaidis et al. ................ | 438/637 |

* cited by examiner

Primary Examiner—Duy-Vu N. Deo
(74) Attorney, Agent, or Firm—Slater & Matsil, L.L.P.

(57) ABSTRACT

Self-aligning vias and trenches etched between adjacent lines of metallization allows the area of the dielectric substrate allocated to the via or trench to be significantly reduced without increasing the possibility of electrical shorts to the adjacent lines of metallization.

19 Claims, 4 Drawing Sheets ic # SELF-ALIGNED MASK TO REDUCE CELL LAYOUT AREA

TECHNICAL FIELD

The present invention relates to the manufacture of semiconductor devices and more particularly to a method of reducing the area of a semiconductor cell by using a self-aligned mask for etching selected features, such as a via or trench, from an upper level of metallization through an intermediate dielectric to possibly contact lower level circuits or metallization.

BACKGROUND

As will be appreciated by those skilled in the art, most semiconductor devices have several layers of circuits interconnected by vias etched through insulating and/or dielectric materials separating the two levels of circuits and filled with a conductive material such copper, gold, silver or aluminum. To avoid electrical shorts, it is very important that these vias filled with conductive metals do not unintentionally come into contact with other conductive lines and/or devices. Since electrical circuits and devices in an integrated chip are very small, a via that does successfully connect two levels of circuits together, but is misaligned by only a few tenths of microns may cause shorts and render a full wafer of devices useless. As will be appreciated by those skilled in the art, most misaligned vias are the result of a misaligned etching mask. Therefore, it is important that precautions be taken to be sure minor misalignment will not cause shorts. Perhaps the most common way to avoid such destructive electrical shorts is to increase the area that is allocated for the via etch. That is, increase the separation between circuits, or electrical conductive lines, and the location where the via is etched from an upper level to a lower level. This is, of course, a simple and effective solution. Unfortunately, since each of such multi-layer devices will typically include several vias, and since each wafer includes hundreds of devices, increasing the area for each via is also wasteful and decreases yield.

Therefore, it would be advantageous if misalignment of the etch mask could be avoided so that the area allocated for each via could be reduced.

SUMMARY OF THE INVENTION

These and other problems are generally solved or corrected, and technical advantages are generally achieved, by embodiments of the present invention which provide methods for providing self-aligned features, such as, for example, vias or trenches, on a semiconductor device. The method comprises recessing the top surface of one or more conductors or lines of metallization typically deposited by the Damascene process below the top surface of the surrounding dielectric layer. Recessing the metal may be accomplished by a plasma etch that is selective to the dielectric material or any other suitable process. The recessed conductor or metal lines are then capped by depositing a barrier layer over the top surface of the substrate. The barrier layer may be any suitable material including silicon nitride and silicon carbide and covers the substrate and recessed metal as a substantially constant thickness or conformal coating. Thus, the capping or barrier layer will include a recess directly above the recessed metal lines. According to one embodiment, an intermediate conformal coating or layer of dielectric (ILD) is then deposited over the capping or barrier layer followed by the deposition of a conformal coating of a liner material, such as for example, Tantalum (Ta), Titanium (Ti), Tantalum Nitride (TaN), Titanium Nitride (TiN), Silicon Nitride (SiN) or Silicon Carbide (SiC). However, for certain applications and depending on future processing steps, it may be appropriate to eliminate the depositing of the ILD and deposit the liner material directly over the conformal capping or barrier layer. The layer of liner material is then planarized such that the "high" areas of the conformal liner are removed so that only the low areas remain. However, the "low" areas will also be directly above (aligned with) the metal lines recessed below the top surface of the surrounding dielectric materials. Therefore, by using the remaining areas of the liner layer as a hard mask, vias can be etched through the dielectric layer of the substrate that are very close to, but not in contact with, the adjacent conductor or line of metallization. Similarly, higher density wiring can be obtained by using this method to etch trenches that extend to a relatively shallow depth in the dielectric. For circuit building purposes, it may be advantageous to create structures with very high capacitance, in which case trenches or similar structures may be formed using the methods of this invention, and which serve the purpose of creating circuit elements with high capacitance. It can therefore be seen that, while via formation is an ideal use of this invention's techniques, one is not limited to forming vias only.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
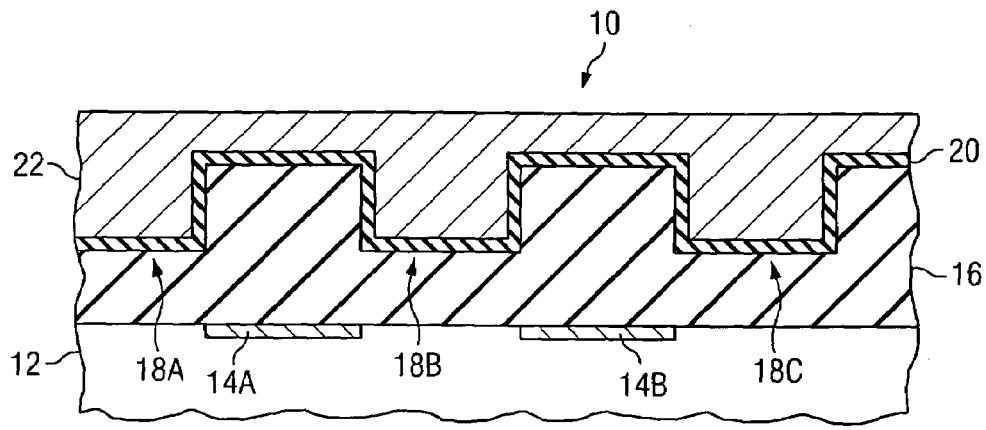
FIGS. 1A–1C illustrate typical prior art steps in providing a metallization level by the Damascene process.

Referring now to the prior art FIG. 1A, there is shown a cross-section of a substrate with conductor or lines of metallization formed in a dielectric. Typically, the lines of metallization will be formed by the Damascene process but could be formed by any other suitable technique. As shown, a substrate 10 is comprised of a first level of dielectric 12 which may include a multiplicity of various types of selected circuits. For example, the connecting pads 14a and 14b may represent connections to lines of metallization or terminals of various circuits such as the bit line of memory cells located in dielectric layer 12. Thus, it should be understood the substrate 10 could represent a single layer of circuits or metallization lines on top of a silicon wafer or, alternatively, the term substrate may be used to represent multiple layers of interconnecting circuits. In any event, there is shown a layer of dielectric material 16 defining a multiplicity of trenches 18a, 18b and 18c etched therein. The sidewalls and bottom of the trenches as well as the top surface of dielectric layer 16 may be covered by a barrier layer or material 20 deposited such as by a CVD (chemical vapor deposition) process to prevent the migration of metallic or metal ions, such as for example, copper ions, into the dielectric. After the barrier layer 20 is deposited, a suitable conductive material 22, such as, for example only, copper, or aluminum, is deposited to fill the trench and cover the top surface of the dielectric layer 16.

Figure 1B:
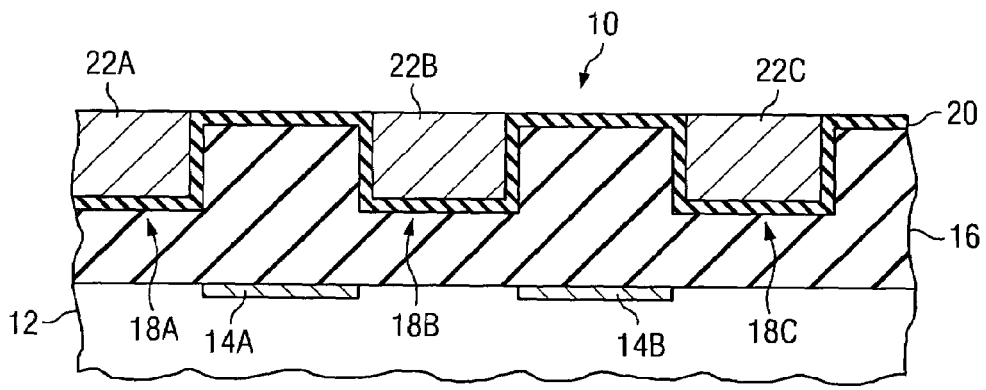
Figure 1C:
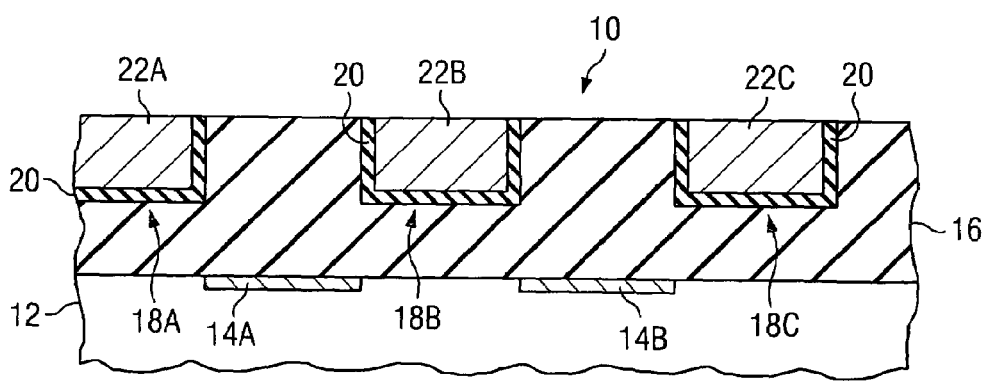

The excess copper or conductive material 22 and those portions of the barrier material 20 covering the top surface of the dielectric material 16 are then removed to obtain the strips of metallization 22a, 22b and 22c defined in the lined trenches 18a, 18b and 18c as shown in FIG. 1C. The configuration of FIG. 1C may be achieved, for example, by a two step CMP (chemical-mechanical polishing) process. The first polishing step would use a polishing chemical selective to the barrier layer 20 so as to remove the copper or other metallization down to the barrier layer 20 as shown in FIG. 1B. The second polishing step would then use a chemical selective to the dielectric 16 to remove those portions of the barrier layer or material 20 that are on top of the dielectric 16 as shown in FIG. 1C. It will be appreciated by those skilled in the art that to this point, traditional Damascene processing steps have been used.

Figure 2A:
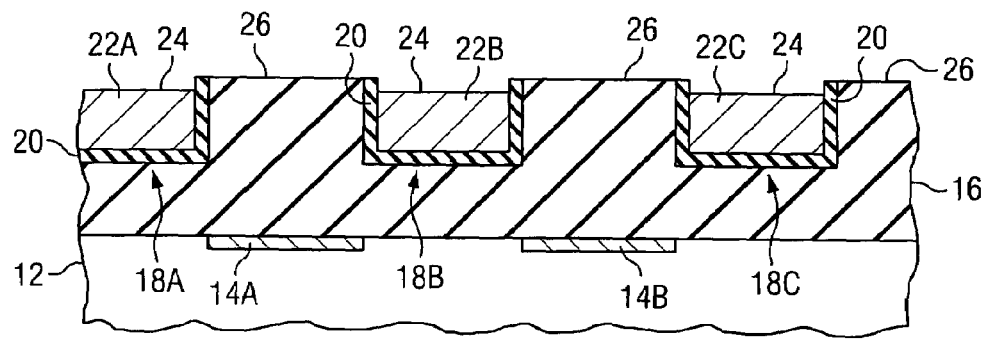
FIGS. 2A–2G illustrate the processing steps of the present invention.
Figure 2B:
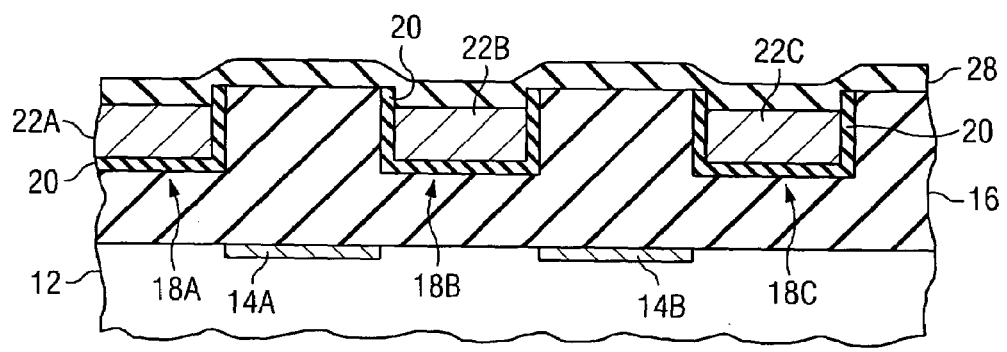
Figure 2C:
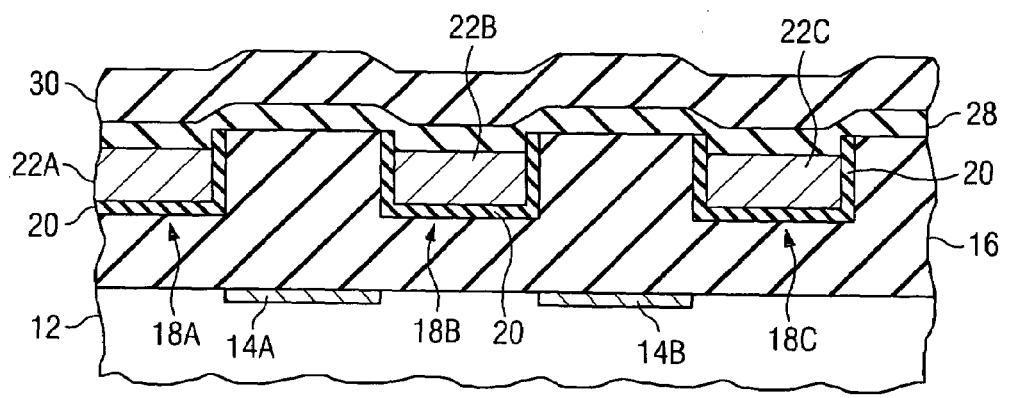
Figure 2D:
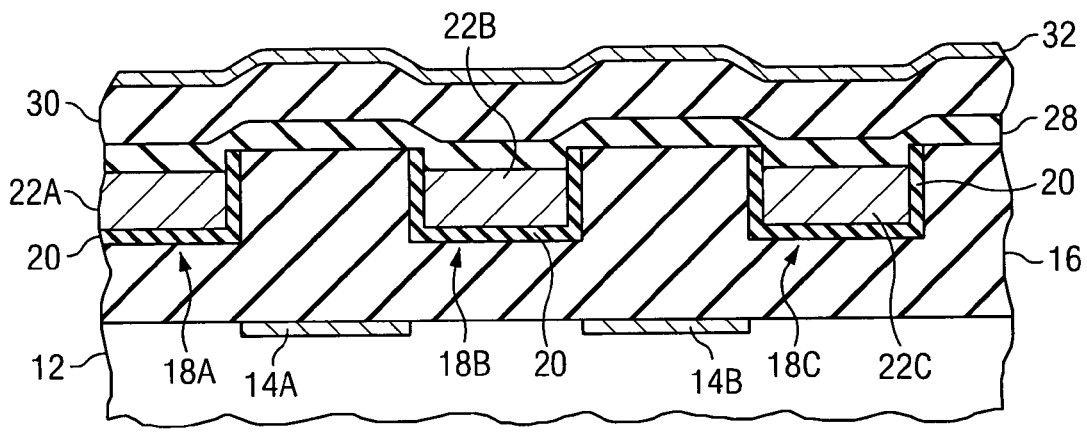
Figure 2E:
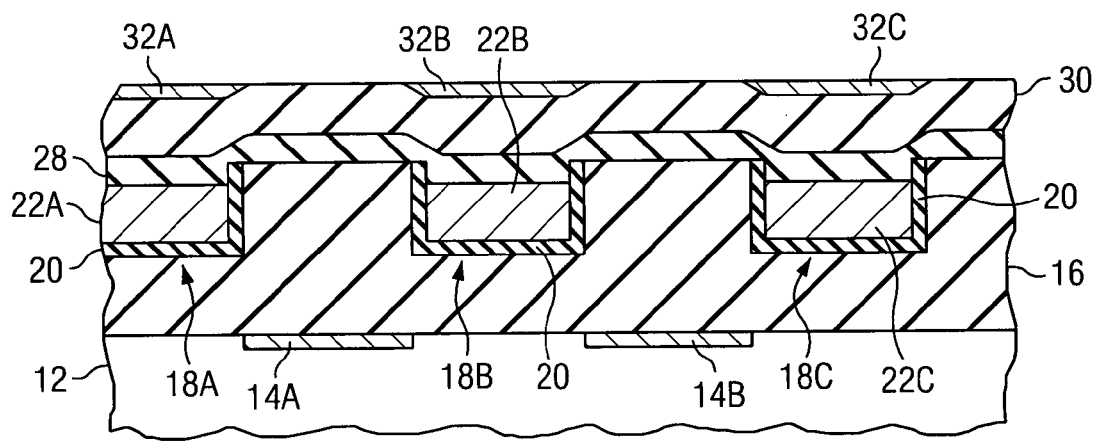
Figure 2F:
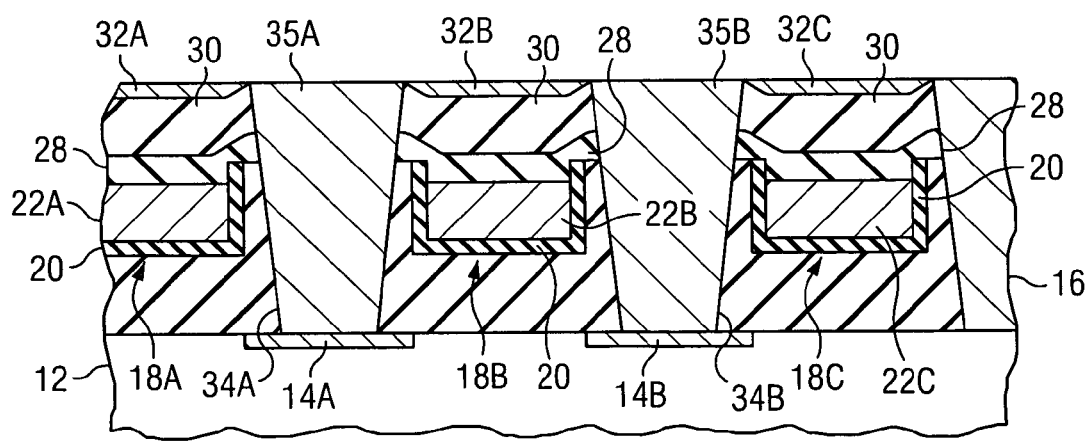
Figure 2G:
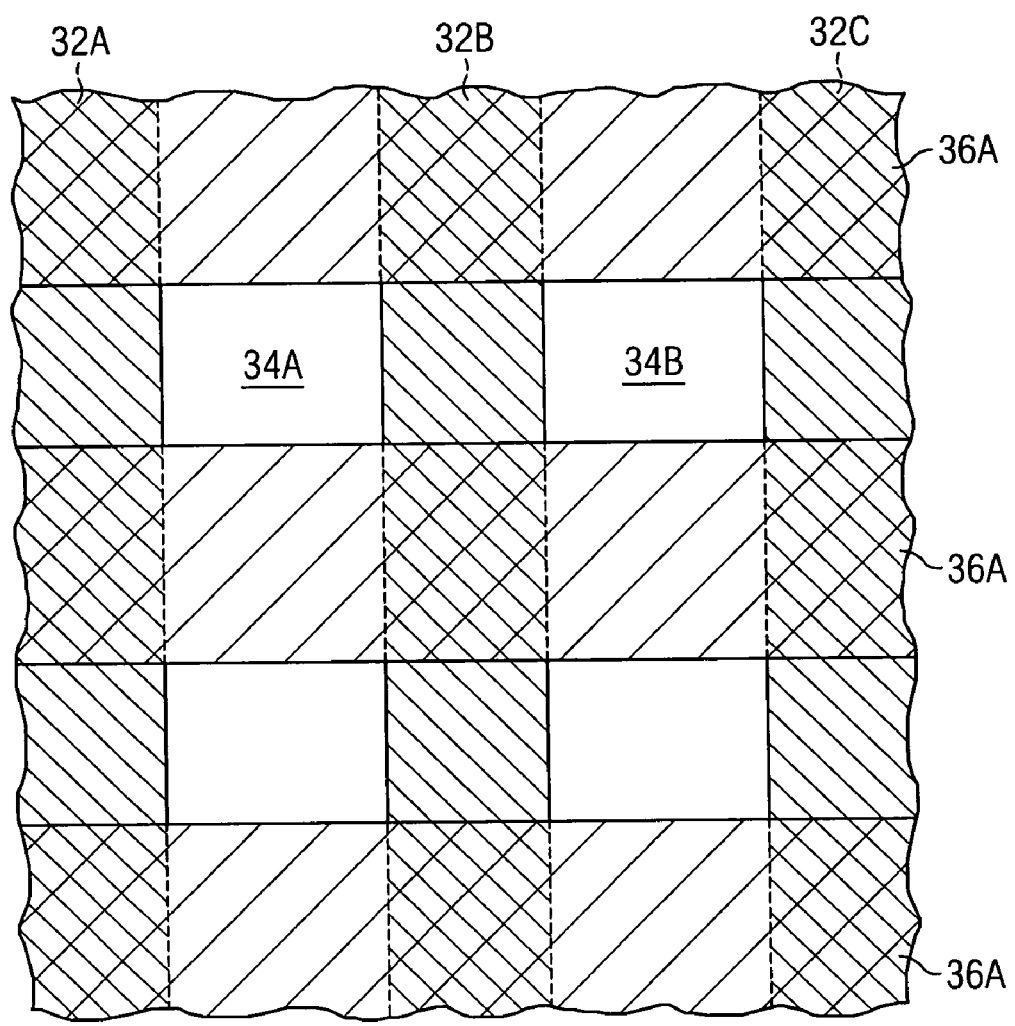

Referring now to FIG. 2A and FIG. 2G, there is described an embodiment of the processing steps of the present invention. As shown in FIG. 2A, the surface of the line of metallization or copper 22a, 22b and 22c has been recessed by a process step that is chosen to be selective to the dielectric layer 16. An effective process step for recessing the lines of metallization is to use further CMP with a chemical material that removes the copper or metallization lines 22a, 22b and 22c but is selective to the dielectric layer 16. Other process steps that may be suitable include a metal RIE plasma etch or a wet etch that readily removes the metal, yet is also selective to the dielectric layer 16. No matter the process step selected, the result as shown in FIG. 2A is that the top surface 24 of the lines of metallization (copper) 22a, 22b and 22c is recessed between about 20 nm and 100 nm below the top surface 26 of the dielectric material 16.

After the metal has been recessed, a capping dielectric material or barrier layer 28 such as SiN (Silicon Nitride) or SiC (Silicon Carbide) is deposited as a conformal layer over the dielectric material 16 and the recessed metal lines of FIG. 2A such that the top surface of the deposited conformal layer of barrier 28 of dielectric material also has a contoured top surface similar to that of the dielectric 16 and recessed metal lines 22a, 22b and 22c as clearly shown in FIG. 2B. That is, the conformal layer defines recesses above, or aligned with, the recessed copper or metal lines 22a, 22b and 22c and the raised areas above the top surface of the dielectric layer 16.

As shown in FIG. 2C, a conformal ILD (Intermediate Layer of Dielectric) 30 may then be deposited over the contoured top surface over the barrier layer 28 such that the top surface of the ILD also defines recesses over or aligned with the metal lines 22a, 22b and 22c. Although it is believed that most devices fabricated according to this invention will typically need or require an ILD layer, for some applications, ILD layer 30 will not be necessary and the step of depositing the ILD layer 30 may be eliminated.

Therefore, referring to FIG. 2D, a liner 32 is deposited on top of the ILD layer 30. However, if the step of depositing ILD layer 30 is eliminated, liner 32 is deposited directly on top of the capping dielectric conformal layer 28. Regardless of whether an ILD layer 30 is included, it is important to understand that the liner 32 will be deposited over a contoured surface having recesses over the metal lines 22a, 22b and 22c and raised portions of the dielectric layer 16 at a substantial constant thickness so that the liner material 32 will also have low or recessed areas over or aligned with the lines of metallization 22a–22c and high areas over the dielectric material 16. Thus, the liner material 32 conforms with, or is aligned with, the low and high areas of the lines of metallization 22a, 22b and 22c and the dielectric layer 16. Therefore, by planarizing the liner material 32, the remaining low areas 32a, 32b and 32c are aligned with the lines of metallization 22a, 22b and 22c respectively, whereas the high areas of liner material are removed as shown in FIG. 2E. Thus, it will be appreciated that by selecting a liner material that can be used as a hard mask during an etching step, a self-aligned hard mask is formed that will protect the lines of metallization from a subsequent etching process. According to the present invention, the liner materials believed to be particularly suitable for use as a hard mask include, but are not limited to, Tantalum (Ta), Tantalum Nitride (TaN), Titanium (Ti), Titanium Nitride (TiN), Silicon Nitride (SiN), Silicon Carbide (SiC), or other materials that offer protection during the etch of the underlying dielectric.

Referring now to FIG. 2F, two vias 34a and 34b are illustrated as having been etched through ILD layer 30, capping layer 28 and dielectric layer 16 to contact pads 14a and 14b located on the top surface of the lower dielectric layer 12 and filled with copper or other metallization 35a and 35b. As is clearly illustrated, the self-aligned hard mask portions 32a, 32b and 32c allow the vias 34a and 34b to be precisely located between the lines of metallization without causing an electrical short.

Referring now to FIG. 2G, there is shown an example of a top view of the structure discussed with respect to FIG. 2A through 2F with added strips of resist 36a, 36b and 36c located perpendicular to the strips of hard mask 32a, 32b and 32c, which lie over the lines of metallization 22a, 22b and 22c. The vias 34 are precisely placed in the axis perpendicular to the metal lines through the use of the present invention, and are fixed in the axis parallel to the metal lines through the use of a simplified resist mask (strips 36a, 36b, and 36c) that has much relaxed alignment tolerances because of the use of the present invention.

Previous processes that did not use the self-aligning mask process of the present invention typically required twice as much distance between the two intermediate parallel lines of metallization to minimize effects of misalignment such as electrical shorts between the conductive via and the adjacent lines of metallization. For example, the circuitry of FIG. 2F requires a conductive via to extend from an upper level, past an intermediate level having lines of metallization, to a lower level.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, methods and steps described in the specification. As one of ordinary skill in the art will readily appreciate from the disclosure of the present invention, processes, methods, or steps, presently existing or later to be developed, that perform substantially the same function or achieve substantially the same result as the corresponding embodiments described herein may be utilized according to the present invention. Accordingly, the appended claims are intended to include within their scope such processes, methods, or steps.

What is claimed is:

1. A method of providing self-aligning features on a semiconductor device comprising the steps of:
   providing a substrate with a dielectric layer that defines at least one line of metallization;
   recessing the top surface of said at least one line of metallization below the top surface of said dielectric layer;
   capping said at least one line of metallization with a barrier layer deposited over the top surface of said substrate, said barrier layer defining a top surface that follows the contours of the top surface of said at least one line of metallization and said dielectric;
   depositing a layer of liner material over said barrier layer, said layer also following the contours of said at least one line of metallization and said dielectric;
   planarizing said layer of liner material so as to remove high areas such that the low areas of said liner material remain; and
   etching selected features in said dielectric layer of said substrate by using said remaining low areas of said liner material as a hard mask.

2. The method of claim 1 wherein said barrier layer is selected from silicon nitride and silicon carbide.

3. The method of claim 1 further comprising the step of depositing an ILD (intermediate layer dielectric) layer over said capping layer before depositing said layer of liner material.

4. The method of claim 1 wherein said layer of liner material is selected from the group consisting of Tantalum (Ta), Tantalum Nitride (TaN), Titanium (Ti), Titanium Nitride (TiN), Silicon Nitride (SiN), and Silicon Carbide (SiC).

5. The method of claim 1 wherein substrate defines at least two spaced apart lines of metallization such that said hard mask defines unmasked areas between said two lines of metallization and said selected etched feature is a via.

6. The method of claim 1 wherein said step of providing comprises the step of providing a substrate with at least one trench defined therein, depositing a barrier liner over said at least one trench and the top surface of said dielectric, and depositing a conductive material over said substrate so as to fill said at least one trench and cover said substrate.

7. The method of claim 6 wherein said conductive material is a metal selected from the group consisting of copper and aluminum.

8. The method of claim 6 further comprising planarizing said deposited conductive material by a method selective to said barrier liner so as to remove said conductive material down to said barrier liner.

9. The method of claim 8 further comprising the step of polishing said substrate to remove said barrier liner covering said dielectric.

10. The method of claim 9 wherein said recessing step comprises the step of polishing said substrate with a material selective to said dielectric layer of said substrate such that said at least one line of metallization is recessed below the top surface of said dielectric.

11. The method of claim 1 wherein said recessing step comprises the step of polishing said substrate with a CMP (chemical-mechanical polishing) material selected to said dielectric layer of said substrate such that said at least one line of metallization is recessed below the top surface of said dielectric.

12. The method of claim 1 wherein said recessing step comprises the step of etching said conductive material selective to said dielectric material.

13. The method of claim 10 further comprising the step of depositing an ILD layer over said capping layer before depositing said layer of liner material.

14. The method of claim 10 wherein said layer of liner material is selected from the group consisting of, Tantalum (Ta), Tantalum Nitride (TaN), Titanium (Ti), Titanium Nitride (TiN), Silicon Nitride (SiN), and Silicon Carbide (SiC).

15. The method of claim 10 wherein said substrate defines at least two spaced apart lines of metallization such that said hard mask defines unmasked areas between said two lines of metallization and said selected etched feature is a via.

16. The method of claim 1 wherein said feature etched in said dielectric layer is a trench.

17. The method of claim 11 further comprising the step of depositing an ILD layer of said capping layer before depositing said layer of liner material.

18. The method of claim 11 wherein said layer of liner material is selected from the group consisting of, Tantalum (Ta), Tantalum Nitride (TaN), Titanium (Ti), Titanium Nitride (TiN), Silicon Nitride (SiN), and Silicon Carbide (SiC).

19. The method of claim 11 wherein said substrate defines at least two spaced apart lines of metallization such that said hard mask defines unmasked areas between said two lines of metallization and said selected etch feature is a via.

* * * * *